United States Patent
Hosaka

(10) Patent No.: US 12,409,558 B2
(45) Date of Patent: Sep. 9, 2025

(54) CONVEYANCE APPARATUS, SUBSTRATE PROCESSING APPARATUS, CONVEYANCE METHOD, AND ARTICLE MANUFACTURING METHOD

(71) Applicant: CANON KABUSHIKI KAISHA, Tokyo (JP)

(72) Inventor: Takashi Hosaka, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 110 days.

(21) Appl. No.: 18/164,470

(22) Filed: Feb. 3, 2023

(65) Prior Publication Data
US 2023/0264359 A1  Aug. 24, 2023

(30) Foreign Application Priority Data
Feb. 22, 2022  (JP) .................... 2022-026120

(51) Int. Cl.
*B25J 9/16* (2006.01)
*B25J 11/00* (2006.01)

(52) U.S. Cl.
CPC ......... *B25J 9/1697* (2013.01); *B25J 11/0095* (2013.01)

(58) Field of Classification Search
CPC .............. B25J 9/1697; B25J 11/0095
USPC ..................................... 318/568.13
See application file for complete search history.

(56) References Cited

U.S. PATENT DOCUMENTS

| | | | |
|---|---|---|---|
| 2020/0183270 | A1 | 6/2020 | Okada |
| 2021/0050246 | A1* | 2/2021 | Choi ............ H01L 21/67132 |

FOREIGN PATENT DOCUMENTS

| | | | |
|---|---|---|---|
| JP | 2002050749 A | | 2/2002 |
| JP | 2005109376 A | * | 4/2005 |
| JP | 2011529626 A | | 12/2011 |
| WO | 2020213571 A1 | | 10/2020 |

* cited by examiner

*Primary Examiner* — Kawing Chan
(74) *Attorney, Agent, or Firm* — Canon U.S.A., Inc. IP Division

(57) ABSTRACT

A conveyance apparatus connected to a substrate processing apparatus configured to bring a pressing member and a material on a substrate into contact with each other to form a cured film of the material on the substrate, the conveyance apparatus includes an acquisition unit configured to acquire a state of a peripheral portion of an adhesion substrate including the pressing member and the substrate adhering to the pressing member with the material interposed in between, a position adjusting unit configured to adjust a position of the adhesion substrate based on a result acquired by the acquisition unit, and a conveyance unit configured to convey the adhesion substrate adjusted by the position adjusting unit.

13 Claims, 13 Drawing Sheets

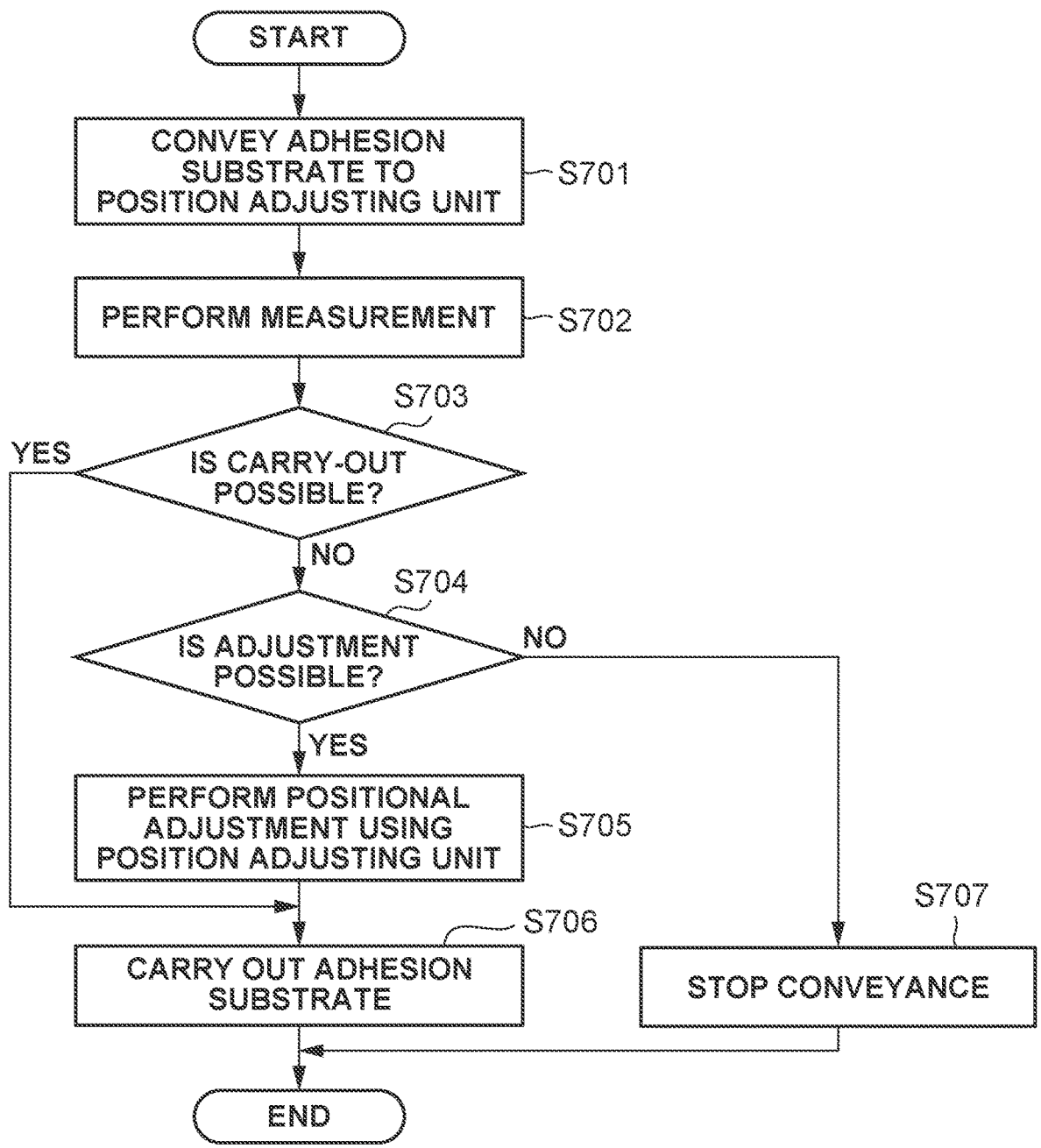

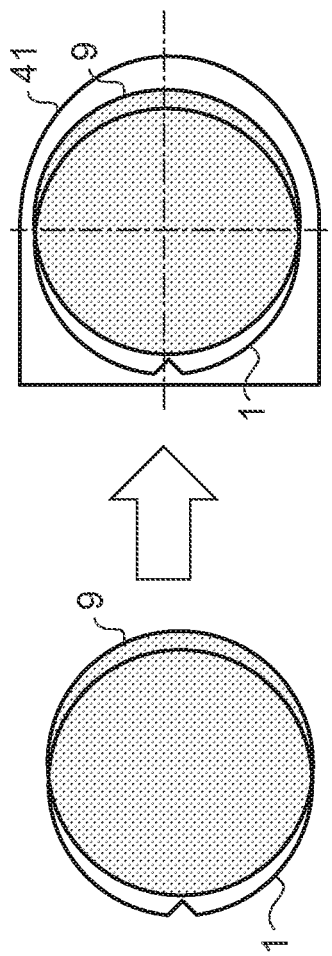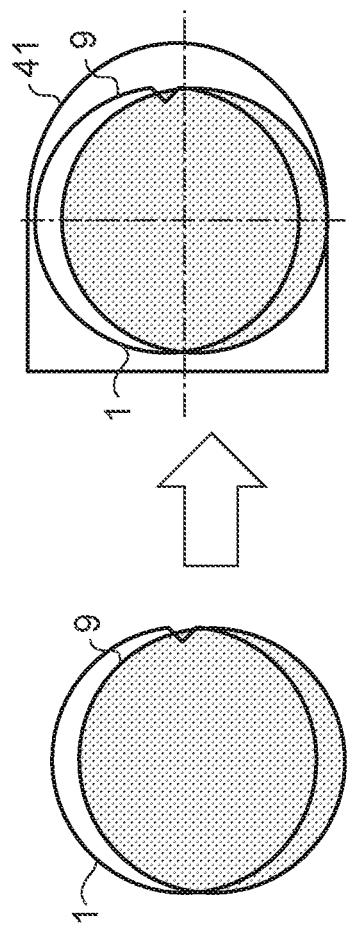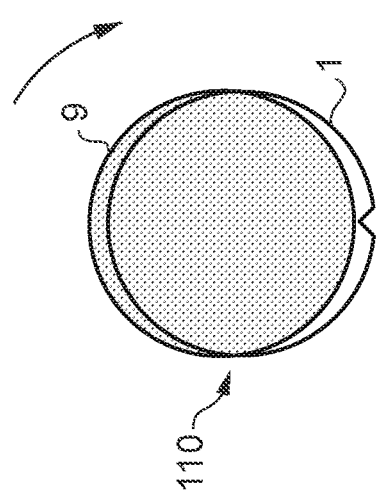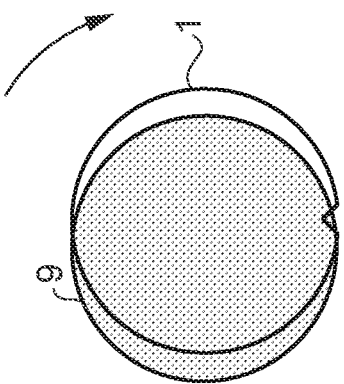
FIG. 8A
FIG. 8B

CONVEYANCE APPARATUS, SUBSTRATE PROCESSING APPARATUS, CONVEYANCE METHOD, AND ARTICLE MANUFACTURING METHOD

BACKGROUND

Field of the Disclosure

The present disclosure relates to a conveyance apparatus, a substrate processing apparatus, a conveyance method, and an article manufacturing method.

Description of the Related Art

As a technique capable of producing a micro structured device according to a design rule on the nanometer order and suitable for mass production, an imprint technique has been put into practical use. The imprint technique is a technique in which a mold (also referred to as a template) having a depression-protrusion structured pattern on a nanometer-scale that is formed using an electron beam drawing apparatus, an exposure apparatus, or the like is brought into contact with a moldable material (an imprint material) on a substrate to transfer the pattern. A photo-curing method is one example of the imprint technique. An imprint apparatus employing the photo-curing method molds, using a mold, a photo-curable imprint material supplied in a shot region on a substrate, cures the imprint material by light irradiation, and separates the mold from the cured imprint material, thereby forming a pattern on the substrate.

In addition, conventionally, there is known a technique (a planarization technique) for planarizing irregularities of a substrate by forming a coating film on the substrate using a coating applicator such as a spin coater. However, the planarization technique (a substrate processing apparatus) using the coating applicator may be insufficient to planarize irregularities of a substrate on a nanoscale. Thus, in recent years, it has been discussed to planarize a substrate using the imprint technique. Japanese Unexamined Patent Application Publication (Translation of PCT Application) No. 2011-529626 discusses making an improvement in accuracy of planarization by dropping a composition based on irregularities of a substrate, and curing the composition in a state where a plate is in contact with the dropped composition.

The planarization using the imprint technique can include a contact process of bringing a plate serving as a pressing member into contact with a composition on a substrate, a curing process of curing the composition in a contact state by light irradiation, and a release process of separating the plate from the cured composition. In the release process, it is necessary to apply a force (a release force) to separate the plate from the composition on the substrate, but the release may fail because of a large adhesive force. In a case where the release fails, it is conceivable that an adhesion substrate in which the plate and the substrate adhere to each other is carried out from the apparatus and moved to a holding housing, and a restoration process of performing the release using a release assisting mechanism using a push pin is performed.

Further, in the contact process, the substrate and the plate are brought into contact with each other to align the center of the substrate and the center of the plate, but the substrate and the plate may come into contact while the centers are misaligned. If the release fails in such a state where the centers are misaligned, it is necessary to perform the restoration process on the adhesion substrate having external dimensions larger than external dimensions of the plate or the substrate. In other words, the plate and the substrate may be damaged by a collision during the movement to the holding housing, or during the release process by the release assisting mechanism.

SUMMARY

According to an aspect of the present disclosure, a conveyance apparatus connected to a substrate processing apparatus configured to bring a pressing member and a material on a substrate into contact with each other to form a cured film of the material on the substrate, the conveyance apparatus includes an acquisition unit configured to acquire a state of a peripheral portion of an adhesion substrate including the pressing member and the substrate adhering to the pressing member with the material interposed in between, a position adjusting unit configured to adjust a position of the adhesion substrate based on a result acquired by the acquisition unit, and a conveyance unit configured to convey the adhesion substrate adjusted by the position adjusting unit.

Further features of the present disclosure will become apparent from the following description of embodiments with reference to the attached drawings.

BRIEF DESCRIPTION OF THE DRAWINGS

FIG. 7 is a flowchart illustrating operation of conveying an adhesion substrate.

FIGS. 8A and 8B are diagrams each illustrating an example in which an adjustment is performed to enable carry-in to a holding housing.

DESCRIPTION OF THE EMBODIMENTS

Exemplary embodiments will be described in detail below with reference to the attached drawings. The following embodiments are not intended to limit the present disclosure set forth in the claims. A plurality of features is described in the embodiments, but not all of the features are necessarily required for the present disclosure, and the plurality of features may be combined as desired. Furthermore, in the attached drawings, identical or similar configurations are denoted by the same reference number, and the description thereof will not be repeated.

Figure 1:
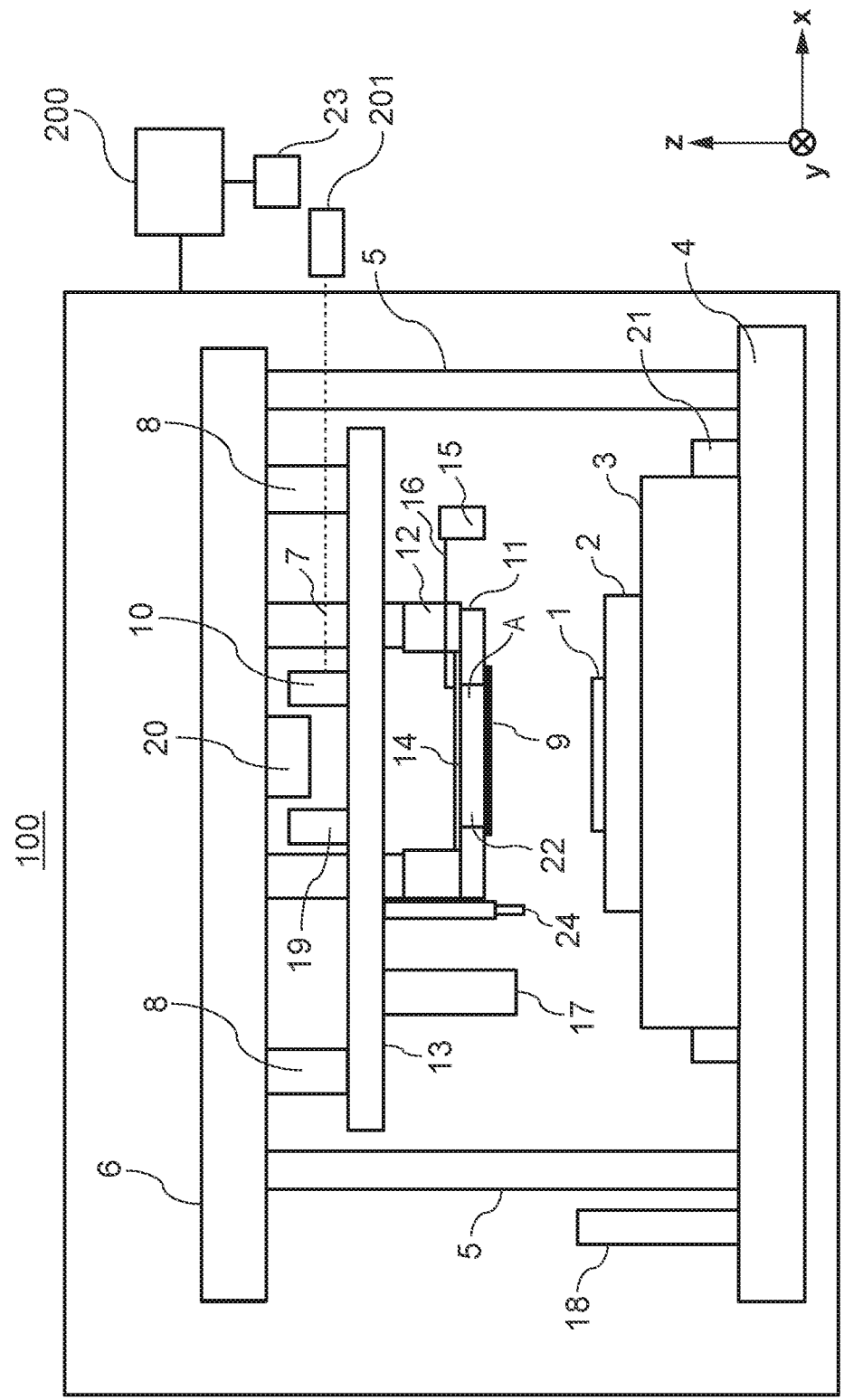
FIG. 1 is a diagram illustrating a configuration of a planarization apparatus (a substrate processing apparatus).

FIG. 1 is a schematic diagram illustrating a substrate processing apparatus 100 according to a first embodiment. The substrate processing apparatus 100 (a molding apparatus) is embodied by a molding apparatus that molds a composition on a substrate 1, using a pressing member 9.

A specific example is a planarization apparatus that cures the composition in a state where the composition on the substrate 1 and the pressing member 9 (also referred to as the plate or super straight) having a flat surface are in contact with each other, and forms a flat layer of the composition on the substrate 1 by separating the plate from the cured composition. Another specific example is an imprint apparatus that cures the composition in a state where the pressing member 9 (also referred to as the mold) having a pattern structure is in contact with the composition on the substrate 1, and forms a pattern structure using the cured composition. The first embodiment will be described below using the example of the planarization apparatus as the substrate processing apparatus 100.

In the present specification and the drawings, directions are indicated in an X-Y-Z coordinate system in which a horizontal plane is an XY plane. Typically, the substrate 1 that is a processing target object is placed on a substrate stage 3 so that a surface thereof is parallel to the horizontal plane (the XY plane). Thus, hereinafter, directions orthogonal to each other in a plane along the surface of the substrate 1 are an X-axis and a Y-axis, and a direction perpendicular to the X-axis and the Y-axis is a Z-axis. Further, hereinafter, directions parallel to the X-axis, the Y-axis, and the Z-axis in the X-Y-Z coordinate system will be referred to as an X direction, a Y direction, a Z direction, respectively, and a rotation direction around the X-axis, a rotation direction around the Y-axis, and a rotation direction around the Z-axis will be referred to as a θX direction, a θY direction, and a θZ direction, respectively.

The planarization apparatus 100 cures the composition in a state where a material on the substrate 1 and the plate 9 are in contact with each other, and separates (releases) the plate 9 from the cured composition, thereby forming a planarized layer of the material on the substrate 1.

For example, the substrate 1 can be a silicon wafer, but is not limited thereto. The substrate 1 can be made of a material freely selected from aluminum, a titanium-tungsten alloy, an aluminum-silicon alloy, an aluminum-copper-silicon alloy, silicon oxide, and silicon nitride. As the substrate 1, a substrate on which an adhesion layer is formed by a surface treatment such as a silane coupling treatment, a silazane treatment, or formation of an organic thin film to improve the adhesion property with respect to the composition may be used. The substrate 1 typically is circular and has a diameter of 300 mm, but is not limited thereto.

The plate 9 can be made of a light transmitting material in consideration of a light irradiation process. Examples of such a material include glass, quartz, a light transmissive resin such as polymethyl methacrylate (PMMA) or a polycarbonate resin, a transparent metal vapor deposition film, a flexible film such as dimethylpolysiloxane, a photocurable film, and a metal film. Although it is desirable that the plate 9 have a circular shape having a diameter greater than 300 mm and smaller than 500 mm, the shape of the plate 9 is not limited thereto. In addition, the thickness of the plate 9 is desirably greater than or equal to 0.25 mm and less than 2 mm, but the thickness thereof is not limited thereto.

The composition can be a curable composition that is cured by being irradiated with light, e.g., an ultraviolet (UV) curable liquid. As the UV curable liquid, typically, a monomer such as an acrylate or a methacrylate can be used. The curable composition may also be referred to as simply a moldable material. Hereinafter, the moldable material will also be referred to simply as a "material".

The planarization apparatus 100 includes a substrate chuck 2, the substrate stage 3, a base platen 4, columns 5, a top plate 6, a guide bar 7, columns 8, an image acquisition device 10, a plate chuck 11, a head 12, and an alignment shelf 13. The planarization apparatus 100 further includes a pressure adjustment unit 15, a supply unit 17, a conveyance unit 18, an alignment scope 19, a light source 20, a stage drive unit 21, an input unit 23, and a control apparatus 200. The substrate chuck 2 and the substrate stage 3 can move the substrate 1 while holding the substrate 1. The plate chuck 11 and the head 12 can move the plate 9 while holding the plate 9.

The substrate 1 is carried in from the outside of the planarization apparatus 100 by the conveyance unit 18 (a conveyance apparatus) including a conveyance hand, and is held by the substrate chuck 2. The substrate stage 3 is supported by the base platen 4, and driven in the X direction and the Y direction to position the substrate 1 held by the substrate chuck 2 at a predetermined location. The stage drive unit 21 includes a linear motor and an air cylinder, and drives the substrate stage 3 at least in the X direction and the Y direction, but may have a function of driving the substrate stage 3 in directions of two or more axes (e.g., six axial directions). The stage drive unit 21 includes a rotation mechanism, and can rotate the substrate chuck 2 or the substrate stage 3 in the θZ direction.

The plate 9 serving as the pressing member is also carried in from the outside of the planarization apparatus 100 by the conveyance unit 18 including the conveyance hand, and is held by the plate chuck 11. The plate 9 has, for example, a circular or rectangular external shape, and has a first surface including a flat surface 25 (to be described with reference to FIG. 2A) to be in contact with the material on the substrate 1, and a second surface opposite to the first surface. In the present embodiment, the flat surface 25 has a size equal to or slightly larger than the size of the substrate 1. The plate chuck 11 is supported by the head 12, and can have a function of correcting a position in the θZ direction (an inclination around the Z-axis) of the plate 9. Each of the plate chuck 11 and the head 12 includes an opening for allowing light (ultraviolet ray) emitted from the light source 20 via a collimator lens to pass therethrough. The plate chuck 11 functions as a holding unit that mechanically holds the plate 9. For example, the plate chuck 11 holds the plate 9 by attracting the second surface in a state where the second surface of the plate 9 faces upward. Further, the head 12 mechanically holds the plate chuck 11. The head 12 forms a drive mechanism (not illustrated) for determining a distance between the substrate 1 and the plate 9 when bringing the plate 9 into contact with the material on the substrate 1 and separating the plate 9 from the material, and moves the plate 9 in the Z direction. For example, the drive mechanism formed by the head 12 can include an actuator such as a linear motor, an air cylinder, or a voice coil motor. Further, a load cell for measuring a pressing force (an imprint force) of the plate 9 applied to the material on the substrate 1 can be disposed in the plate chuck 11 or the head 12. First, a plate deforming mechanism (a plate deforming unit) includes a closing member 14 for forming a closed space, using a space area A formed by a space present inside the plate chuck 11 and an internal space surrounded by the plate 9. The plate deforming mechanism further includes the pressure adjustment unit 15 disposed outside the plate chuck 11 to adjust the pressure in the space area A. The closing member 14 is formed of a light transmitting flat plate member such as quartz glass, and includes a connection port (not illustrated) of a pipe 16 connected to the pressure adjustment unit 15, in a part thereof. The pressure adjustment unit 15 can increase an amount of deformation of the plate 9 protruding toward the substrate 1 by increasing the pressure in the space area A. The pressure adjustment unit 15 can also decrease the amount of deformation of the plate 9 protruding toward the substrate 1 by reducing the pressure in the space area A. The columns 5 supporting the top plate 6 are disposed on the base platen 4. The guide bar 7 is suspended from the top plate 6, penetrates the alignment shelf 13, and is fixed to the head 12. The alignment shelf 13 is suspended from the top plate 6 with the columns 8 interposed in between. The alignment shelf 13 is penetrated by the guide bar 7. In addition, for example, a displacement meter 24 for measuring the height (flatness) of the substrate 1 held by the substrate chuck 2, using an oblique incident image shift method, is disposed on the alignment shelf 13.

The alignment scope 19 includes an optical system and an image pickup system for observing a reference mark on the substrate stage 3 and an alignment mark on the plate 9. However, in a case where the alignment mark is not formed on the plate 9, the alignment scope 19 may not be provided. The alignment scope 19 is used in an alignment where the alignment scope 19 measures a relative position between the reference mark on the substrate stage 3 and the alignment mark on the plate 9 and corrects a positional shift obtained thereby.

The supply unit 17 has a dispenser including a discharge outlet (a nozzle) for discharging the material in an uncured state to the substrate 1, and supplies (applies) the material onto the substrate 1. The supply unit 17 employs a method such as a piezo jet method or a micro solenoid method, and can supply a material having a minute volume of about 1 picoliter (pL) to the substrate 1. The number of discharge outlets in the supply unit 17 is not limited and may be one (a single nozzle), or a plurality of (e.g., 100 or more) nozzles may be used. The plurality of nozzles may form a linear nozzle array in one row or in a plurality of rows.

The image acquisition device 10 acquires an image including a region where the plate 9 and the material on the substrate 1 are in contact with each other. The image acquisition device 10 is located above the head 12, i.e., upstream in the irradiation direction of the light source 20. The image acquisition device 10 is, for example, an image pickup apparatus such as a charge coupled device (CCD) camera, and can acquire information representing an image of a region. The image acquisition device 10 also acquires an image of a region including the substrate 1 and the substrate chuck 2. An image acquisition device different from the image acquisition device 10 may be provided to acquire the image. An image processing device 201 (a processing unit) processes an image and detects the position of an object in the image. The image acquired by the image acquisition device 10 is processed by the image processing device 201, so that the state of a region where the plate 9 and the material on the substrate 1 are in contact with each other can be detected.

The control apparatus 200 includes a computer apparatus including a central processing unit (CPU) and a memory, and controls the entire planarization apparatus 100. The control apparatus 200 functions as a processing unit that performs a planarization process by comprehensively controlling each unit of the planarization apparatus 100. Here, the planarization process is a process of planarizing the material by bringing the flat surface 25 of the plate 9 into contact with the material on the substrate 1 to make the flat surface 25 replicate the surface profile of the substrate 1. In general, the planarization process is performed lot by lot, i.e., for each of a plurality of substrates included in the same lot.

Figure 2A:
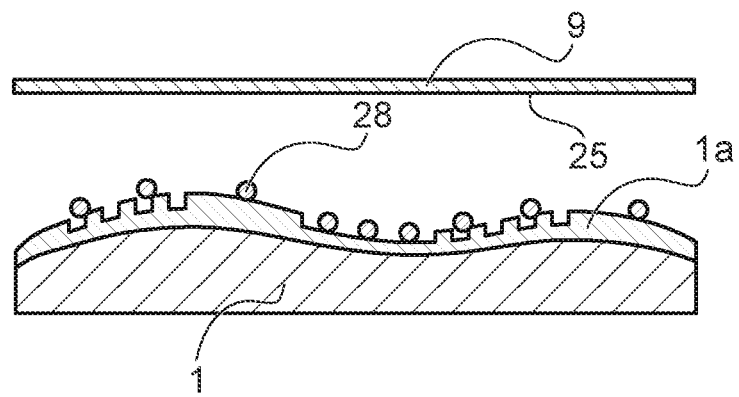
FIGS. 2A, 2B, and 2C are diagrams illustrating a planarization process.
Figure 2B:
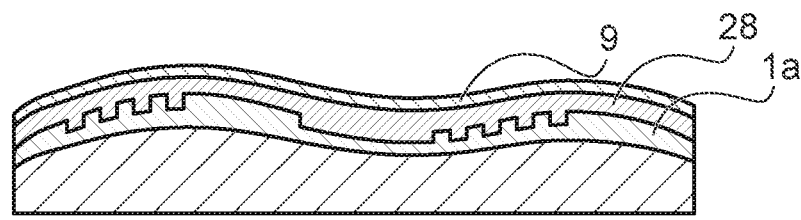
Figure 2C:
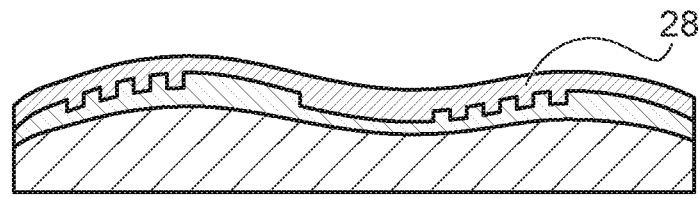

Next, the planarization process by the planarization apparatus 100 will be described with reference to FIGS. 2A, 2B, and 2C. First, a material 28 is supplied by the supply unit 17 to the substrate 1 where a base pattern 1a is formed. FIG. 2A illustrates a state after the material 28 is placed on the substrate 1 and before the plate 9 is brought into contact with the material 28. Next, as illustrated in FIG. 2B, the material 28 on the substrate 1 and the flat surface 25 of the plate 9 are brought into contact with each other. The plate 9 presses the material 28 so that the material 28 spreads over the entire surface of the substrate 1. FIG. 2B illustrates a state where the entire surface of the flat surface 25 of the plate 9 is in contact with the material 28 on the substrate 1, and the flat surface 25 of the plate 9 replicates the surface profile of the substrate 1. Subsequently, in the state illustrated in FIG. 2B, the material 28 on the substrate 1 is irradiated with light from the light source 20 via the plate 9, so that the material 28 is cured. Afterward, the plate 9 is separated from the cured material 28 on the substrate 1. A cured layer (a planarized layer) of the material 28 having a uniform thickness is thereby formed on the entire surface of the substrate 1. FIG. 2C illustrates a state where the planarized layer of the material 28 is formed on the substrate 1. Hereinafter, the contact (adhesion) and the separation between the flat surface 25 of the plate 9 and the material 28 on the substrate 1 will be referred to simply as the contact (adhesion) and the separation between the plate 9 and the material 28 on the substrate 1, respectively.

The planarization process of the planarization apparatus 100 has been described with reference to FIGS. 2A, 2B, and 2C. However, because the substrate processing apparatus according to the present disclosure is also applicable to the imprint apparatus that forms the pattern on the substrate, an imprint process by the imprint apparatus will also be described with reference to FIGS. 3A, 3B, and 3C.

Figure 3A:
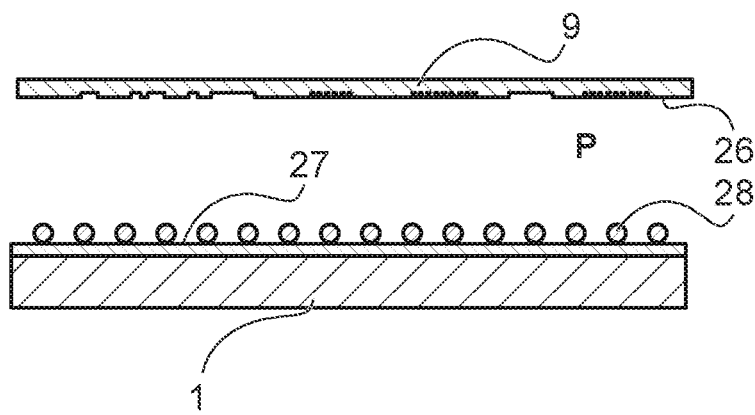
FIGS. 3A, 3B, and 3C are diagrams illustrating an imprint process.
Figure 3B:
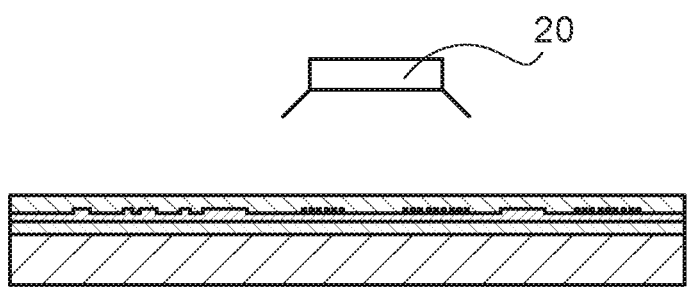
Figure 3C:
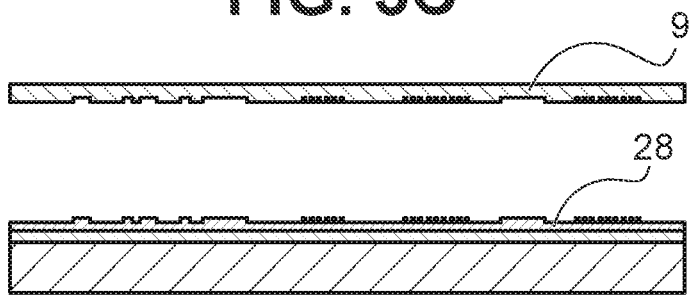

FIG. 3A illustrates a state after the material 28 is supplied onto the substrate 1 and before a mold serving as the pressing member 9 is brought into contact with the material 28. The mold 9 has a pattern surface 26, and a pattern structure P is formed in a pattern area of the pattern surface 26. The pattern structure P can be composed of depressions and protrusions formed on the pattern surface 26. Then, as illustrated in FIG. 3B, the substrate 1 to which the material 28 has been applied and the mold 9 having the pattern structure P of the pattern surface 26 are brought into contact with each other. FIG. 3B illustrates a state where the entire surface of the mold 9 having the pattern structure P is in contact with the material 28 on the substrate 1, and the pattern surface 26 of the mold 9 has replicated the surface profile of the substrate 1. Subsequently, in the state illustrated in FIG. 3B, the material 28 on the substrate 1 is irradiated with light from the light source 20 via the mold 9, so that the material 28 is cured. Then, the mold 9 is separated from the cured material 28 on the substrate 1 (a release process). A cured layer having a pattern structure can be thereby formed on the entire surface of the substrate 1. FIG. 3C illustrates a state where the pattern of the material 28 is formed on the substrate 1. Hereinafter, the contact (adhesion) and the separation between the pattern surface 26 of the mold 9 and the material 28 on the substrate 1 will be referred to simply as the contact (adhesion) and the separation between the mold 9 and the material 28 on the substrate 1, respectively.

Figure 4:
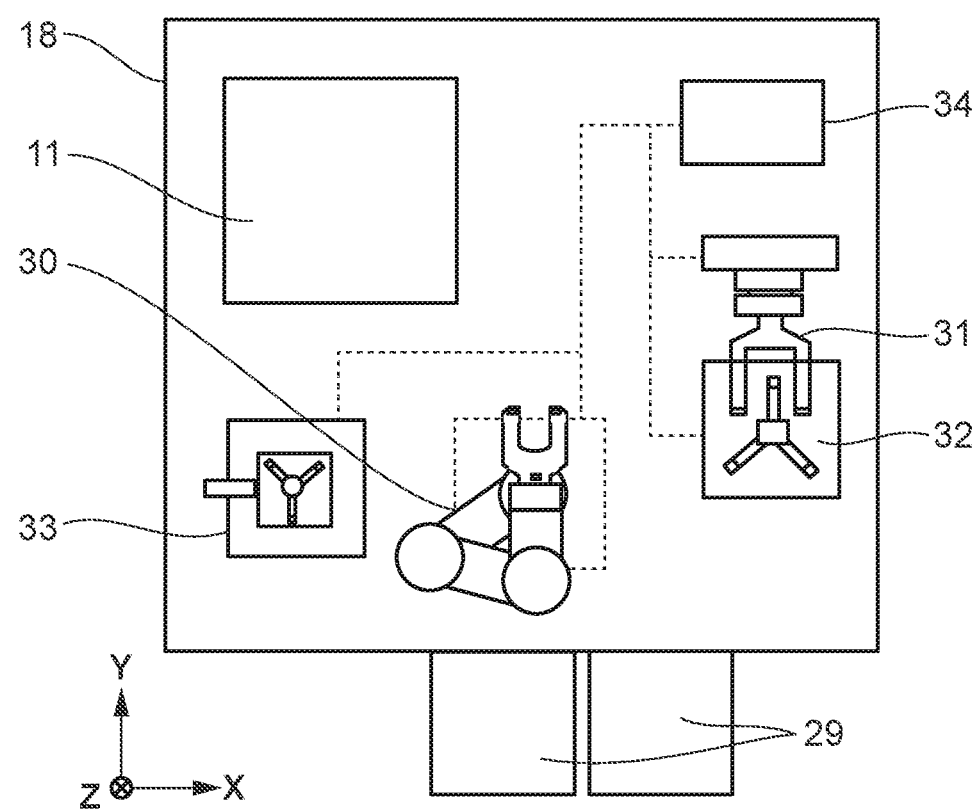
FIG. 4 is a diagram illustrating a conveyance apparatus.

Next, the conveyance of the plate 9 and the substrate 1 will be described with reference to FIG. 4. FIG. 4 is a diagram illustrating an example of a configuration with regard to the conveyance unit 18. The conveyance unit 18 may be provided to each of the plate 9 and the substrate 1, but may be shared as illustrated in FIG. 4. In the present embodiment, the conveyance unit 18 will be described as a part of the planarization apparatus 100, but the conveyance unit 18 may be provided as a device external to the planarization apparatus 100 to convey the plate 9 and the substrate 1 to the planarization apparatus 100. The transfer of the plate 9 and the substrate 1 between the inside and the outside of the planarization apparatus 100 is performed via a load port 29. The load port 29 is an interface portion for taking out and inserting the substrate 1 present inside a front opening unified pod (FOUP) used as a holding housing, from and into the planarization apparatus 100. In the present embodiment, a plurality of plates or a plurality of substrates is stored in the FOUP.

First, a method of conveying the substrate 1 by the conveyance unit 18 will be described. A conveyance hand 30 holds the substrate 1 and conveys the substrate 1. The conveyance hand 30 can include an edge clamp that uses a pad for holding the substrate 1, or vacuum suction. The conveyance hand 30 acquires the substrate 1 carried in from the FOUP via the load port 29 and conveys the acquired substrate 1 to a position adjusting unit 33. The position adjusting unit 33 adjusts the central position of the substrate 1 and adjusts the alignment of the substrate 1 in the rotation direction so that a sending-in position when conveying the substrate 1 to the substrate chuck 2 of the substrate stage 3 is always constant. The position adjusting unit 33 includes a drive stage 38 and a substrate holding mechanism 40 (both to be described with reference to FIG. 6A), and an acquisition unit. The drive stage 38 has a drive mechanism for each of the X, Y, Z, θX, θY, and θZ directions.

The substrate holding mechanism 40 holds the substrate 1 by suction using a substrate suction pad or the like. Vacuum suction, electrostatic suction, and other suction method may be used for the suction. For the positioning adjustment (pre-alignment) of the substrate 1, the adjustment can be performed using the acquisition unit that can acquire the position of the substrate 1. A specific configuration of the acquisition unit can be implemented by a measurement unit 37 (to be described with reference to FIG. 6A) that can acquire position information about a peripheral portion of the substrate 1 while rotating the substrate 1. The acquisition unit may include an image pickup device such as a CCD camera, and a processor that detects the position of an object on an image by processing the image.

The substrate 1 whose position is adjusted by the position adjusting unit 33 is acquired by the conveyance hand 30, and the acquired substrate 1 is conveyed to the substrate chuck 2 in the planarization apparatus 100. Subsequently, the substrate 1 is subjected to the planarization process in the planarization apparatus 100. Afterward, the substrate 1 is acquired using the conveyance hand 30 from the substrate chuck 2, and the acquired substrate 1 is carried out to the FOUP of the load port 29.

Next, a method of conveying the plate 9 using the conveyance unit 18 will be described. The conveyance hand 30 acquires the plate 9 carried in from the FOUP via the load port 29, and conveys the acquired plate 9 to a reversing unit 31. The reversing unit 31 includes a holding mechanism for holding the plate 9 and a rotation mechanism for rotating the holding mechanism 180 degrees. The reversing unit 31 further includes a holding mechanism 32 that temporarily holds the reversed plate 9. The plate 9, which is disposed on the holding mechanism 32 so that a downward facing surface of the plate 9 is the first surface (the front side) and an upward facing surface of the plate 9 is the second surface (the back side), is acquired by the conveyance hand 30 from the holding mechanism 32, and the acquired plate 9 is conveyed to the position adjusting unit 33. The position adjusting unit 33 adjusts the central position of the plate 9 and adjusts the positioning of the plate 9 in the rotation direction so that a sending-in position when conveying the plate 9 to the plate chuck 11 of the head 12 is always constant. The plate 9 whose positioning is adjusted by the position adjusting unit 33 is acquired by the conveyance hand 30, and the acquired plate 9 is conveyed to the plate chuck 11 in the planarization apparatus 100. Subsequently, after the planarization process is fully completed in the planarization apparatus 100, the plate 9 is acquired by the conveyance hand 30 from the plate chuck 11. After the plate 9 is rotated 180 degrees by the reversing unit 31, the rotated plate 9 is carried out to the FOUP of the load port 29. The plate chuck 11 may be removable from the head 12, and the plate 9 may be mounted on the plate chuck 11 in the conveyance unit 18 and carried in to or carried out from the planarization apparatus in this state.

A controller 34 controls operation of each of the plate chuck 11, the reversing unit 31, the conveyance hand 30, the load port 29, and the position adjusting unit 33. The controller 34 may be implemented by the control apparatus 200.

Next, how the plate 9 and the substrate 1 overlap each other when the planarization apparatus 100 brings the plate 9 and the substrate 1 into contact with each other with the material 28 in between will be described with reference to FIGS. 5A, 5B, 5C, 5D, 5E, and 5F. Here, illustration of the material 28 is omitted, and there is illustrated an example in which the plate 9 having a circular shape and made of a light transmitting material in consideration of the light irradiation process is used, and a silicon substrate having also a circular shape and about the same size as the size of the plate 9 is used as the substrate 1. A notch N indicating the orientation of the substrate 1 is formed on the substrate edge of the substrate 1.

Figure 5A:
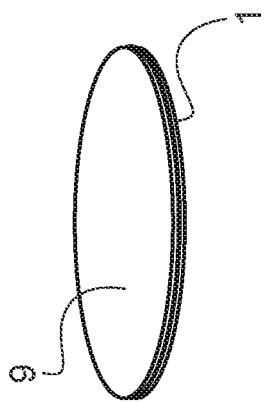
FIGS. 5A, 5B, 5C, 5D, 5E, and 5F are diagrams illustrating states where a substrate and a plate adhere to each other.
Figure 5B:
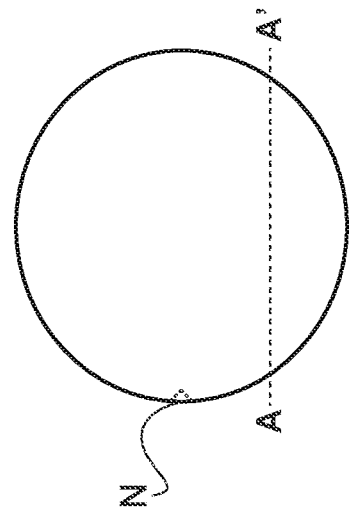
Figure 5C:
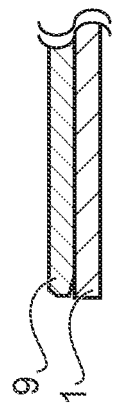
Figure 5D:
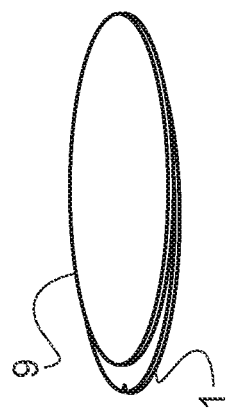
Figure 5E:
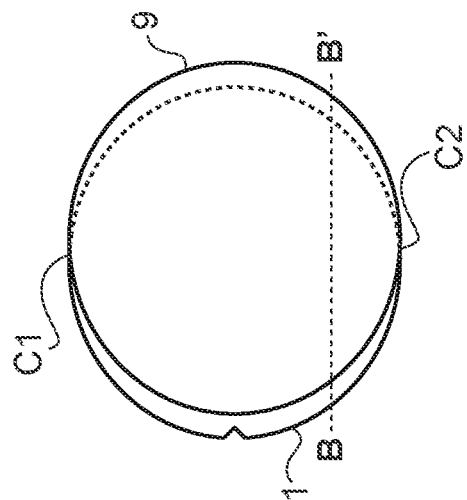
Figure 5F:
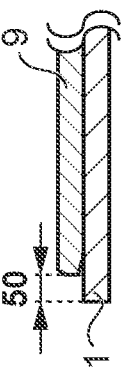

FIGS. 5A to 5C illustrate a state where the central position of the plate 9 and the central position of the substrate 1 are aligned and the plate 9 and the substrate 1 adhere to each other, and FIGS. 5D to 5F illustrate a state where the central position of the plate 9 and the central position of the substrate 1 are not aligned and the plate 9 and the substrate 1 adhere to each other. FIG. 5B is a diagram illustrating the plate 9 and the substrate 1 viewed from above the plate 9 (in the Z-axis), and a single circle is formed in a case where the central position of the plate 9 and the central position of the substrate 1 are aligned as illustrated in FIG. 5B. FIG. 5C is a cross-sectional diagram at an A-A' position in FIG. 5B. In a case where the plate 9 and the substrate 1 adhere to each other and have the respective central positions being aligned, end surface position of the plate 9 and the end surface position of the substrate 1 are aligned.

FIG. 5E is a diagram illustrating the plate 9 and the substrate 1 viewed from above the plate 9 (in the Z-axis), and as illustrated in FIG. 5E, two overlapping circles are formed in a case where the plate 9 and the substrate 1 adhere to each other in a state where the respective central positions are not aligned. The plate 9 and the substrate 1 have overlapping edge positions C1 and C2. FIG. 5F is a cross-sectional diagram at a B-B' position in FIG. 5E. The end surface position of the plate 9 and the end surface position of the substrate 1 are not aligned, and a region 50 of only the plate 9 or the substrate 1 is generated at each of both end surfaces. In other words, this is a state where the external dimensions of the two overlapping circles are larger than the external dimensions of the plate 9 or the substrate 1 alone.

In this way, in the planarization apparatus 100, the plate 9 and the substrate 1 are overlapped with each other to align the respective central positions when being brought into contact with each other, but a case where the central positions are not aligned because of a positional shift or the like can occur.

In addition, in the release process of the planarization apparatus 100, it is necessary to apply a force (a release force) to separate the plate 9 from the material on the substrate 1, but the release can fail because of a large adhesive force. In the case where the release thus fails, it is conceivable that an adhesion substrate in which the plate 9 and the substrate 1 adhere to each other is carried out from the apparatus once and moved to the FOUP, and the restoration process of performing the release using a release assisting mechanism is performed.

In such a process, in a case where the plate 9 and the substrate 1 in the adhesion substrate adhere to each other in the state where the respective central positions are not aligned as illustrated in FIGS. 5D to 5F, it is necessary to carry out the adhesion substrate having external dimensions larger than external dimensions of the substrate 1 or the plate 9 to the FOUP or the release assisting mechanism. However, because of the unexpectedly large external dimensions, the plate 9 and the substrate 1 can be damaged by interference with the FOUP or a member inside the apparatus during the conveyance.

In the present embodiment, there will be described a method of measuring the edge position of the peripheral portion of the adhesion substrate in which the plate 9 and the substrate 1 adhere to each other and fail to separate from each other by the measurement unit 37, and then conveying the adhesion substrate after a positional adjustment is performed, so that the adhesion substrate can be handled without interference.

FIG. 7 is a flowchart illustrating operation of the conveyance unit 18 (the planarization apparatus 100) when the release process in the planarization process is determined as having failed and an adhesion substrate 110 is carried out. The controller 34 or the control apparatus 200 comprehensively controls each unit, thereby executing the following process.

Figure 6A:
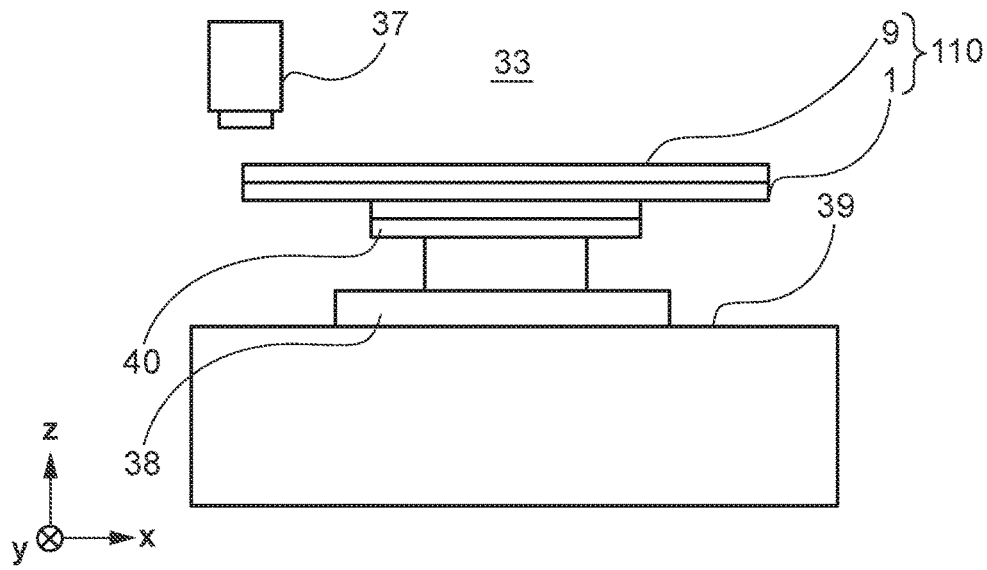
FIGS. 6A, 6B, and 6C are diagrams illustrating a configuration of a position adjusting unit and acquired measurement values.

In step S701, the controller 34 conveys the adhesion substrate 110, in which the plate 9 and the substrate 1 adhere to each other and fail to separate from each other because of a strong adhesive force between the plate 9 and the substrate 1 in a release processing process, to the position adjusting unit 33 by controlling the conveyance hand 30. The adhesion substrate 110 conveyed to the position adjusting unit 33 is held by the substrate holding mechanism 40 of the position adjusting unit 33 as illustrated in FIG. 6A.

In step S702, the controller 34 rotates the adhesion substrate 110 by controlling the drive stage 38 of the position adjusting unit 33, and acquires position information such as an overlap position and an overlap amount by measuring the state of the peripheral portion of the adhesion substrate 110 formed of the plate 9 and the substrate 1, using the measurement unit 37 of the position adjusting unit 33. A detailed measurement method in the measurement unit 37 will be described below.

In step S703, based on the acquired position information, the controller 34 determines whether it is possible to carry out the adhesion substrate 110 without causing a collision to the FOUP mounted in the load port 29 that carries out without performing a positional adjustment. In a case where the adhesion substrate 110 has no positional shift as illustrated in FIG. 5A or has a small positional shift, it is possible to determine that the adhesion substrate 110 can be carried out as it is. Specifically, the determination can be performed based on whether a positional shift amount exceeds a predetermined threshold.

In a case where the controller 34 determines that it is possible to carry out the adhesion substrate 110 without a positional adjustment (YES in step S703), the operation proceeds to step S706. In step S706, the adhesion substrate 110 is carried out to the holding housing such as the FOUP, and the process ends. In a case where the controller 34 determines that the carry-out is not possible because interference with the FOUP or the like can occur if the adhesion substrate 110 is carried out as it is (NO in step S703), the operation proceeds to step S704. In step S704, the controller 34 determines whether the positional shift is a shift in a range adjustable by the position adjusting unit 33 based on the acquired position information. Specifically, the determination can be performed based on whether the positional shift amount exceeds a predetermined threshold for enabling an adjustment by the position adjusting unit 33.

In a case where the controller 34 determines that the adjustment is possible (YES in step S704), the operation proceeds to step S705. In step S705, the controller 34 performs a positional adjustment on the adhesion substrate 110 to establish a state where no interference occurs during carry-out to the FOUP, by moving the drive stage 38 of the position adjusting unit 33 in the X and Y directions and by rotating the drive stage 38 of the position adjusting unit 33 in a θ direction. Afterward, the operation proceeds to step S706. In step S706, the adhesion substrate 110 is carried out to the holding housing such as the FOUP, and the process ends.

On the other hand, in a case where the controller 34 determines that the adjustment is not possible (NO in step S704), the adhesion substrate 110 cannot be safely carried out, and thus the operation proceeds to step S707. In step S707, the controller 34 stops the conveyance of the adhesion substrate 110 from the conveyance unit 18 by the conveyance hand 30, and prompts manual carry-out by a person such as an operator.

By such a process, the adhesion substrate 110 that has failed to be separated can be safely carried out from the planarization apparatus 100 (a planarization processing unit).

Next, the measurement method used by the measurement unit 37 when a substrate overlapping state is determined will be described with reference to FIGS. 6A, 6B, and 6C. FIG. 6A is a diagram illustrating a configuration of the position adjusting unit 33. The position adjusting unit 33 includes the drive stage 38, a support portion 39, the substrate holding mechanism 40, and the measurement unit 37. The drive stage 38 has the drive mechanism (not illustrated) for the X and Y directions and the θ rotation direction. The support portion 39 supports the drive stage 38. The substrate holding mechanism 40 holds the substrate 1. The measurement unit 37 is disposed at a position where the measurement unit 37 can measure the position of the peripheral portion of the adhesion substrate 110, i.e., the positions of the end surface of the substrate 1 and the end surface of the plate 9, when the adhesion substrate 110 is rotated by the drive stage 38. The substrate 1, which is placed on the substrate holding mechanism 40 on the drive stage 38 by the conveyance hand 30, is held by the substrate suction pad in the substrate holding mechanism 40. Vacuum suction, electrostatic suction, and other suction method may be used for the suction.

The drive stage 38 is rotated, and the measurement unit 37 measures the end surface position of the substrate 1 and the end surface position of the plate 9, thereby acquiring position information about the peripheral portion of the adhesion substrate 110 (i.e., an overlap position and an overlap amount between the plate 9 and the substrate 1) and position information about the substrate 1. Based on the information such as the overlap position and the overlap amount acquired by the measurement unit 37, the drive stage 38 is moved in the X and Y directions and rotated in the θ direction to avoid interference at the FOUP and during the conveyance, so that the position of the adhesion substrate 110 is adjusted. This makes it possible to prevent the adhesion substrate 110 from being damaged in a collision during the process of conveyance from the planarization apparatus 100 to the FOUP mounted in the load port 29.

Figure 6B:
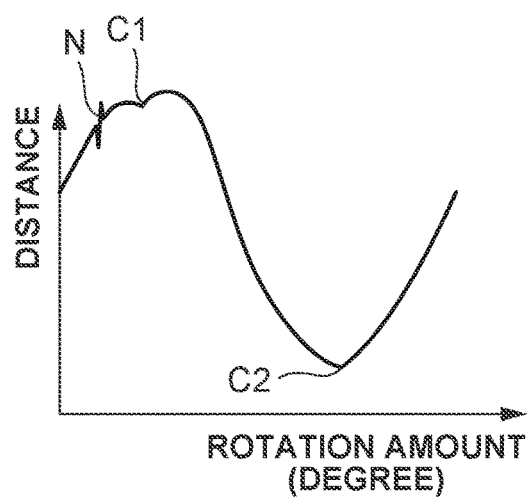
Figure 6C:
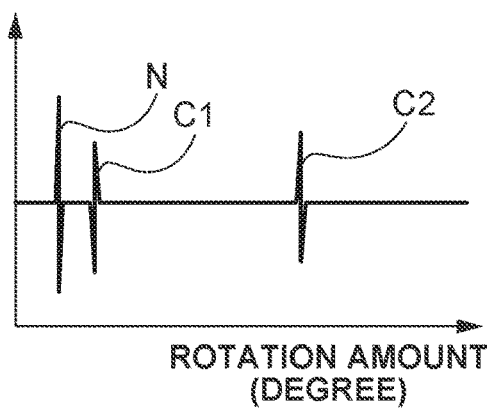

FIG. 6B is a waveform chart illustrating a signal acquired by the measurement unit 37. When the drive stage 38 holding the adhesion substrate 110 rotates, the position of the edge (peripheral portion) of the adhesion substrate 110 in a radial direction continually changes, and thus waveform data indicated by a solid line can be obtained as the position information. With regard to the waveform data, a signal processing device (not illustrated) of the position adjusting unit 33 performs the first-order differentiation on the above-described signal, so that a signal illustrated in FIG. 6C is obtained. Here, if the first-order differentiation signal is horizontally linear, it can be said that the central position of the substrate 1 and the central position of the plate 9 are in an aligned state. However, in a case where the plate 9 and the substrate 1 overlap each other in a shifted state as in FIG. 5D, the position of the notch N of the substrate 1 and the overlapping edge positions C1 and C2 of the substrate 1 and the plate 9 are detected by the first-order differentiation. If a notch position of the substrate 1 is identified, the overlap position between the plate 9 and the substrate 1 can be identified based on the notch position. An overlap amount can also be calculated from a rotation amount of a distance between the positions C1 and C2. From the data obtained by the first-order differentiation, a distinction between the notch N and the overlapping edge positions C1 and C2 can be made based on a peak amount and a change section amount of each of the notch N and the overlapping edge positions C1 and C2. Using the results, the position is adjusted by the position adjusting unit 33 not to cause a collision of the substrate 1 during the carry-out, and subsequently, the carry-out is performed.

FIGS. 8A and 8B each illustrate an example in which the adhesion substrate 110 is carried in to a FOUP 41 after the position is adjusted by the position adjusting unit 33. In FIG. 8A, the adhesion substrate 110 is carried in after the position thereof is adjusted by the position adjusting unit 33 rotating the adhesion substrate 110 so that the longitudinal direction of the adhesion substrate 110 is parallel with the direction of carry-in to the FOUP 41 and the central position of the adhesion substrate 110 is aligned with the central position of the FOUP 41. In FIG. 8B, the position thereof is adjusted by the position adjusting unit 33 rotating the adhesion substrate 110 so that the longitudinal direction of the adhesion substrate 110 intersects the direction of carry-in to the FOUP 41 and the central position of the adhesion substrate 110 is aligned with the central position of the FOUP 41. Such an adjustment can be appropriately performed to avoid interfere with the FOUP or the like, depending on the size of the FOUP 41 and the shift amount of the adhesion substrate 110.

The first embodiment is described based on the example in which the measurement unit 37 that measures the edge position of the adhesion substrate 110 is provided in the position adjusting unit 33 as the acquisition unit. In a second embodiment, there will be described an example in which a displacement meter 24 in a measurement device 60 is used as the acquisition unit in place of the position adjusting unit 33. In the present embodiment, a part different from the first embodiment will be mainly described, and description of a similar part will be omitted.

Figure 10:
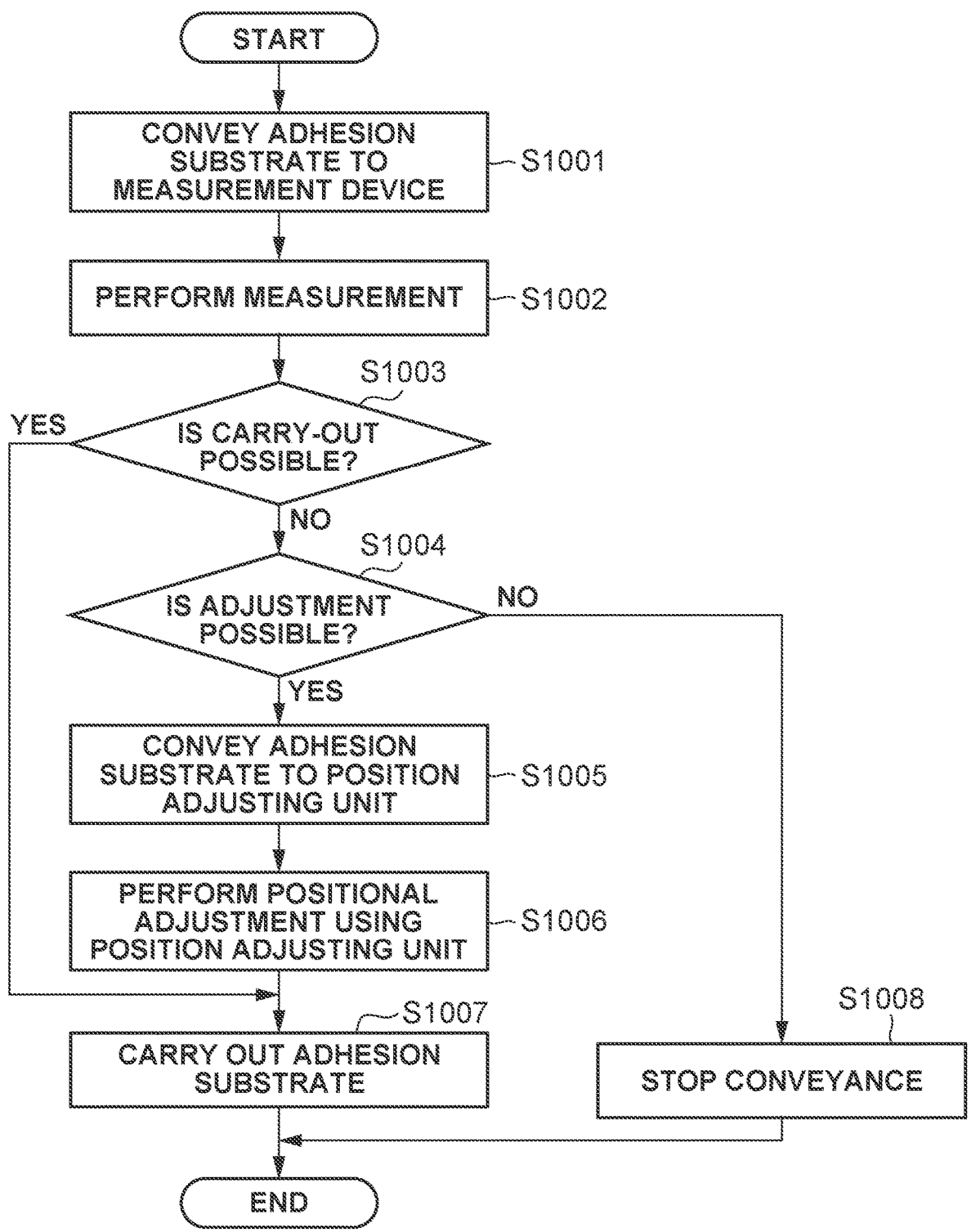
FIG. 10 is a flowchart illustrating operation of conveying an adhesion substrate.

FIG. 10 is a flowchart illustrating operation of a conveyance unit 18 (a planarization apparatus 100) when release in a planarization process is determined to have failed and an adhesion substrate 110 is carried out. A controller 34 or a control apparatus 200 comprehensively controls each unit, thereby executing the following process.

Figure 9A:
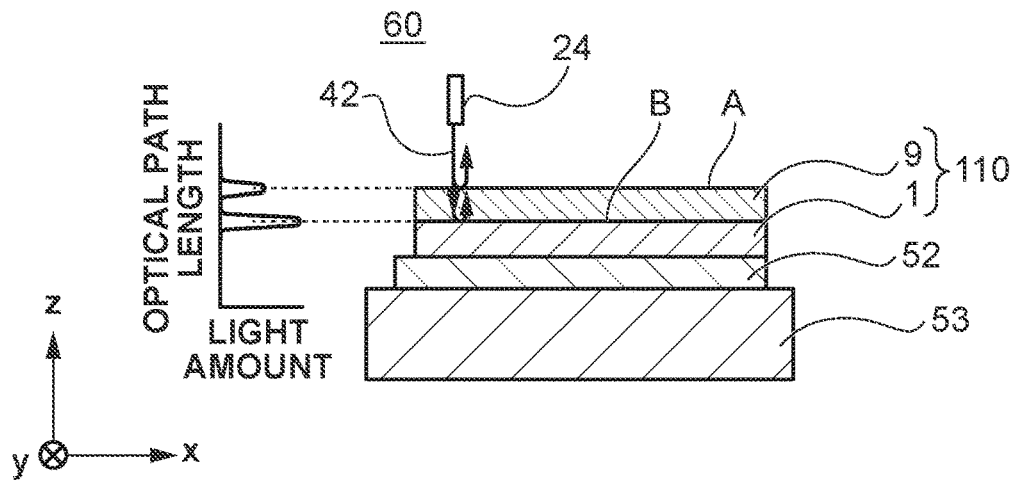
FIGS. 9A, 9B, and 9C are diagrams each illustrating a configuration of a displacement meter and acquired data.

In step S1001, the controller 34 conveys the adhesion substrate 110 in which a plate 9 and a substrate 1 adhere to each other and fail to separate from each other because of a strong adhesive force between the plate 9 and the substrate 1 in a release processing process, to the measurement device 60 by controlling a conveyance hand 30. The adhesion substrate 110 conveyed to the measurement device 60 is held by a substrate chuck 52 of the measurement device 60 as illustrated in FIG. 9A.

In step S1002, the controller 34 rotates the adhesion substrate 110 by controlling a drive stage 53 of the measurement device 60, and acquires position information such as an overlap position and an overlap amount by measuring the state of the peripheral portion of each of the plate 9 and the substrate 1, using the displacement meter 24 of the measurement device 60. A detailed measurement method in the displacement meter 24 will be described below.

In step S1003, based on the acquired position information, the controller 34 determines whether it is possible to carry out the adhesion substrate 110 without causing a collision to an FOUP mounted in a load port 29 that carries out without performing a positional adjustment. In a case where the adhesion substrate 110 has no positional shift as illustrated in FIG. 5A or has a small positional shift, it is possible to determine that the adhesion substrate 110 can be carried out as it is. Specifically, the determination can be performed based on whether a positional shift amount exceeds a predetermined threshold.

In a case where the controller 34 determines that it is possible to carry out the adhesion substrate 110 without a positional adjustment (YES in step S1003), the operation proceeds to step S1007. In step S1007, the adhesion substrate 110 is carried out to a holding housing such as the FOUP, and the process ends. In a case where the controller 34 determines that the carry-out is not possible because interference with the FOUP or the like can occur if the adhesion substrate 110 is carried out as it is (NO in step S1003), the operation proceeds to step S1004. In step S1004, the controller 34 determines whether the positional shift is a shift in a range adjustable by a position adjusting unit 33 based on the acquired position information. Specifically, the determination can be performed based on whether the positional shift amount exceeds a predetermined threshold for enabling an adjustment by the position adjusting unit 33.

In a case where the controller 34 determines that the adjustment is possible (YES in step S1004), the operation proceeds to step S1005. In step S1005, the controller 34 conveys the adhesion substrate 110 from the measurement device 60 to the position adjusting unit 33.

In step S1006, the controller 34 performs a positional adjustment on the adhesion substrate 110 to establish a state where no interference occurs during carry-out to the FOUP, by moving a drive stage 38 of the position adjusting unit 33 in X and Y directions and by rotating the drive stage 38 of the position adjusting unit 33 in a θ direction. Afterward, the operation proceeds to step S1007. In step S1007, the adhesion substrate 110 is carried out to the holding housing such as the FOUP, and the process ends.

On the other hand, in a case where the controller 34 determines that the adjustment is not possible (NO in step S1004), the adhesion substrate 110 cannot be safely carried out, and thus the operation proceeds to step S1008. In step S1008, the controller 34 stops the conveyance of the adhesion substrate 110 from the conveyance unit 18 by the conveyance hand 30, and prompts manual carry-out by a person such as an operator.

By such a process, the adhesion substrate 110 that has failed to be separated can be safely carried out from the planarization apparatus 100 (a planarization processing unit).

The measurement method using the displacement meter 24 of the measurement device 60 according to the present embodiment will be described with reference to FIGS. 9A, 9B, and 9C.

The measurement device 60 may be provided inside the conveyance unit 18 or may be provided outside the conveyance unit 18. The measurement device 60 includes the substrate chuck 52, the drive stage 53, and the displacement meter 24. The substrate chuck 52 holds the substrate 1. The drive stage 53 includes a drive mechanism (not illustrated) for the X and Y directions and the θ rotation direction.

For example, a spectral interference laser displacement meter for spectral interferometry can be used for the displacement meter 24.

The displacement meter 24 is disposed at a position where light is emitted toward the plate 9 from an upper surface of the substrate chuck 52. FIG. 9A is a cross-sectional diagram illustrating the adhesion substrate 110 in which the plate 9 and the substrate 1 overlap each other and have the respective central positions being aligned as in FIG. 5A. The plate 9 is made of a light transmitting resin. The light emitted from the displacement meter 24 reflects off each of a surface A of the plate 9 and an upper surface B of the substrate 1, and returns to the displacement meter 24. An optical path 42 indicates the light reflected by each of these surfaces. In a graph that indicates the intensity of light in an optical path length measured by the displacement meter 24, the surface position of each of the plate 9 and the substrate 1 is indicated by an optical path length and a light intensity peak.

Figure 9B:
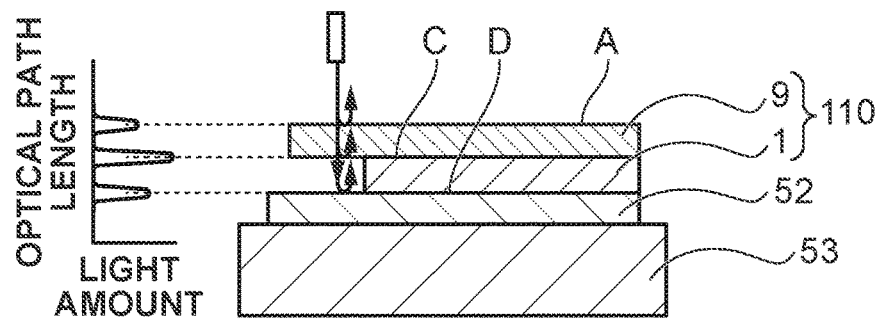
Figure 9C:
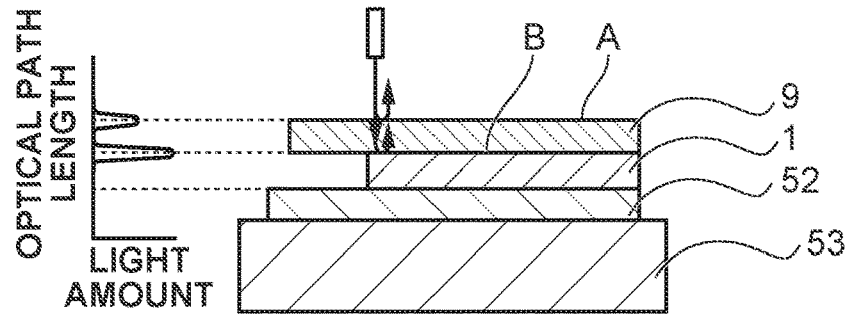

FIG. 9B is a cross-sectional diagram illustrating the adhesion substrate 110 having a positional shift because the central position of the plate 9 and the central position of the substrate 1 are not aligned as in FIG. 5B. The light emitted from the displacement meter 24 reflects off each of the surface A of the plate 9, an adhesion surface C of the plate 9, and a substrate chuck surface D, and returns to the displacement meter 24. In a graph that indicates the intensity of light in an optical path length measured by the displacement meter 24, the position of each of the surface of the plate 9, the adhesion surface of the plate 9, and the surface of the substrate chuck 52 is indicated as an optical path length and a light intensity peak. Occurrence of a shift in a positional relationship between the plate 9 and the substrate 1 can be determined from the number of such peaks. FIG. 9C illustrates measurement by the displacement meter 24 after the drive stage 53 is X-driven from the position in FIG. 9B. In FIG. 9C, the light emitted from the displacement meter 24 reflects off each of the surface A of the plate 9 and the upper surface B of the substrate 1, and returns to the displacement meter 24. An overlap amount of the adhesion substrate 110 can be identified from a change in the X-drive amount of the drive stage 53 and the number of peaks of light intensity. In a case where the spectral interference laser displacement meter is used as the displacement meter 24, a light intensity peak position (distance) changes because of the influence of the refractive index of air and glass, and thus a reflection surface and a peak position can be shifted. However, FIGS. 9A, 9B, and 9C illustrate waveforms corrected based on only the difference in refractive index depending on the material, for convenience. Further, while the upper surface B of the substrate 1 is expressed as the reflection surface for the light from the displacement meter 24, the light can reflect off the adhesion surface C of the plate 9 because the upper surface B of the substrate 1 and the adhesion surface C of the plate 9 are substantially at the same position. However, in this measurement method, which one of these surfaces is the reflection surface does not matter. The method makes it possible to identify the position information (an overlap position and an overlap amount) about the plate 9 and the substrate 1 by measuring at least three points of the substrate peripheral portion using the displacement meter 24. In other words, the measurement after the drive stage 53 is rotated in the θ direction is repeated, so that measurement at a plurality of positions of the adhesion substrate 110 by the displacement meter 24 can be performed.

In a third embodiment, there will be described a method of acquiring position information (an overlap position and an overlap amount) between a plate and a substrate using an image acquisition device that can acquire an image of a peripheral portion of the substrate as the acquisition unit.

Figure 11A:
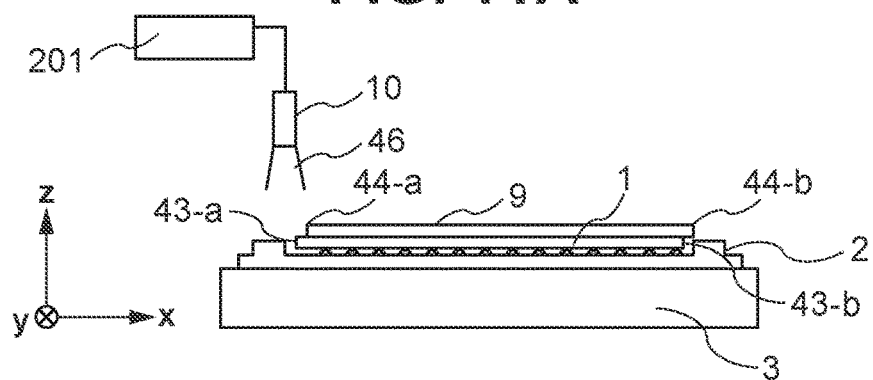
FIGS. 11A, 11B, and 11C are diagrams illustrating a configuration of an image acquisition device and acquired images.

In the present embodiment, there will be described an example of using an image acquisition device 10 used to acquire an image including a region where a plate 9 of a planarization apparatus 100 and a material on a substrate 1 are in contact with each other, but an image acquisition device separately provided in a conveyance unit 18 can also be used. FIG. 11A is a diagram illustrating a side view of the image acquisition device 10. In a case where the position information about an adhesion substrate in which the plate and the substrate adhere to each other is acquired by the image acquisition device 10, the position information is acquired in a state where the substrate 1 is adsorbed by the substrate chuck 2. In the example in FIG. 11A, the image acquisition device 10 acquires an image at each of a plurality of positions of a substrate edge 43 of the substrate 1 and a plate edge 44 of the plate 9. A part imaged by the image acquisition device 10 is a measurement area 46. The measurement area 46 is a range in which the substrate edge 43 and the plate edge 44 can be simultaneously measured.

Figure 11B:
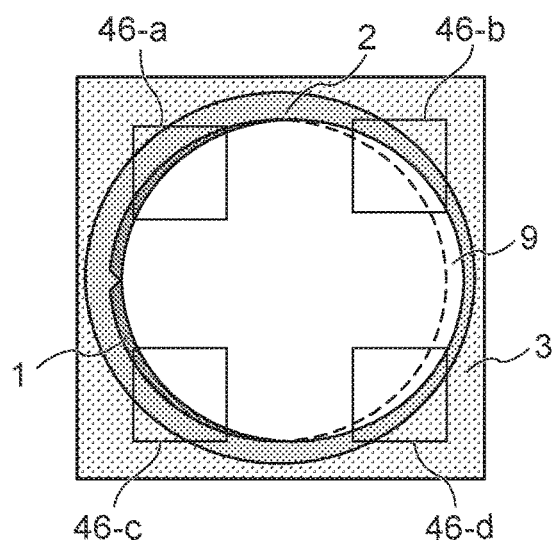

In the example in FIG. 11B, four measurement areas 46 are illustrated, and two pairs of measurement areas 46 are located at the respective positions symmetrical about the central point of an inner peripheral portion of the substrate chuck 2. The number and the positions of the measurement areas 46 whose images are acquired are not limited to the illustrated number and positions. The number and the positions of the measurement areas 46 may be input from a console screen (not illustrated) of a substrate processing apparatus by a user, the input number and positions may be saved in a storage unit (not illustrated) of a control apparatus 200, and the input number and positions of the measurement areas 46 whose images are to be acquired by the image acquisition device 10 may be changed as appropriate.

Figure 11C:
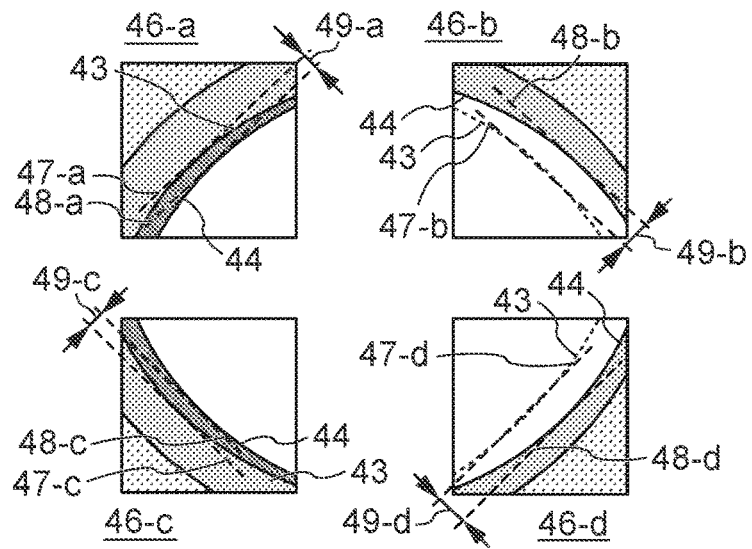

FIG. 11C illustrates an enlarged view of an image of the measurement area 46 in FIG. 11B. From the image acquired by the image acquisition device 10, the image processing device 201 detects a circular arc of each of the substrate edge 43 and the plate edge 44 using a technique of detecting a circular arc such as the Hough transform. Subsequently, the image processing device 201 can determine a positional shift amount of the central point of each of the substrate edge 43 and the plate edge 44 with respect to the circular arc. An average value or a mean value of a plurality of correction amounts determined from images of a plurality of measurement areas, or a value determined by other statistical technique may be used as a correction amount.

It is also possible to determine a positional shift amount based on a distance between a tangent to the circular arc of the substrate edge 43 and a tangent to the circular arc of the plate edge 44 after detecting the circular arc of each of the substrate edge 43 and the plate edge 44 from the images of the four measurement areas 46. Specifically, at first, in an example of a measurement area 46-$a$ in FIG. 9C, a tangent 47-$a$ passing through a point on the circular arc of the substrate edge 43 and in contact with the circular arc of the substrate edge 43 is determined. Next, a tangent 48-$a$ in contact with the circular arc of the plate edge 44 and in parallel with the tangent 47-$a$ is determined. Subsequently, a distance 49-$a$ between the tangent 47-$a$ and the tangent 48-$a$ is determined.

A measurement area 46-$d$ is located at a position symmetrical to the position of the measurement area 46-$a$ with respect to the central point of the substrate chuck 2. In the measurement area 46-$d$, as with the measurement area 46-$a$, a circular arc of each of the substrate edge 43 and the plate edge 44 is detected from the image acquired by the image acquisition device 10.

A tangent 47-$d$ of the substrate edge 43 and a tangent 48-$d$ of the plate edge 44 which are parallel to the tangent 47-$a$ or the tangent 48-$a$ are determined, and a distance 49-$d$ between the tangent 47-$d$ and the tangent 48-$d$ is determined. Subsequently, a positional shift amount S−1 between the substrate edge 43 and the plate edge 44 in a direction orthogonal to the tangent 47-$a$ can be determined from a difference between the distance 49-$a$ and the distance 49-$d$.

Next, using a similar method, a tangent 47-$b$ and a tangent 48-$b$ are determined from an image of a measurement area 46-$b$, and a distance 49-$b$ between the tangents is determined. Similarly, a tangent 47-$c$ and a tangent 48-$c$ are determined from an image of a measurement area 46-$c$, and a distance 49-$c$ between the tangents is determined. Subsequently, a positional shift amount S−2 between the substrate edge 43 and the plate edge 44 in a direction orthogonal to the tangent 47-$b$ can be determined from a difference between the distance 49-$b$ and the distance 49-$c$.

Further, a positional shift amount S can be determined from a combination of the positional shift amount S−1 in the direction orthogonal to the tangent 47-$a$ and the positional shift amount S−2 in the direction orthogonal to the tangent 47-$b$. In other words, the positional shift amount S can be determined from the distance between the tangents parallel to each other in each pair at four points on the circular arc of the substrate 1 and four points on the circular arc of the circular arc of the plate 9.

The process in and after step S1003 in FIG. 10 is performed using the positional shift amount S thus determined, so that the adhesion substrate that fails to be separated can be safely carried out from the planarization apparatus 100 (the planarization processing unit) in the present embodiment as well.

In the first embodiment to the third embodiment, the adjustment method when the adhesion substrate is conveyed to the holding housing such as the FOUP is described. In a fourth embodiment, a method of releasing an adhesion substrate using a release assisting mechanism will be described.

The present embodiment will be described using an example in which a release assisting mechanism 45 is in a substrate stage 3 (see FIGS. 12A to 12D). However, a release device having the release assisting mechanism 45 may be provided as an external device of a planarization apparatus 100 to convey a plate 9 and a substrate 1 to the planarization apparatus 100.

Figure 13:
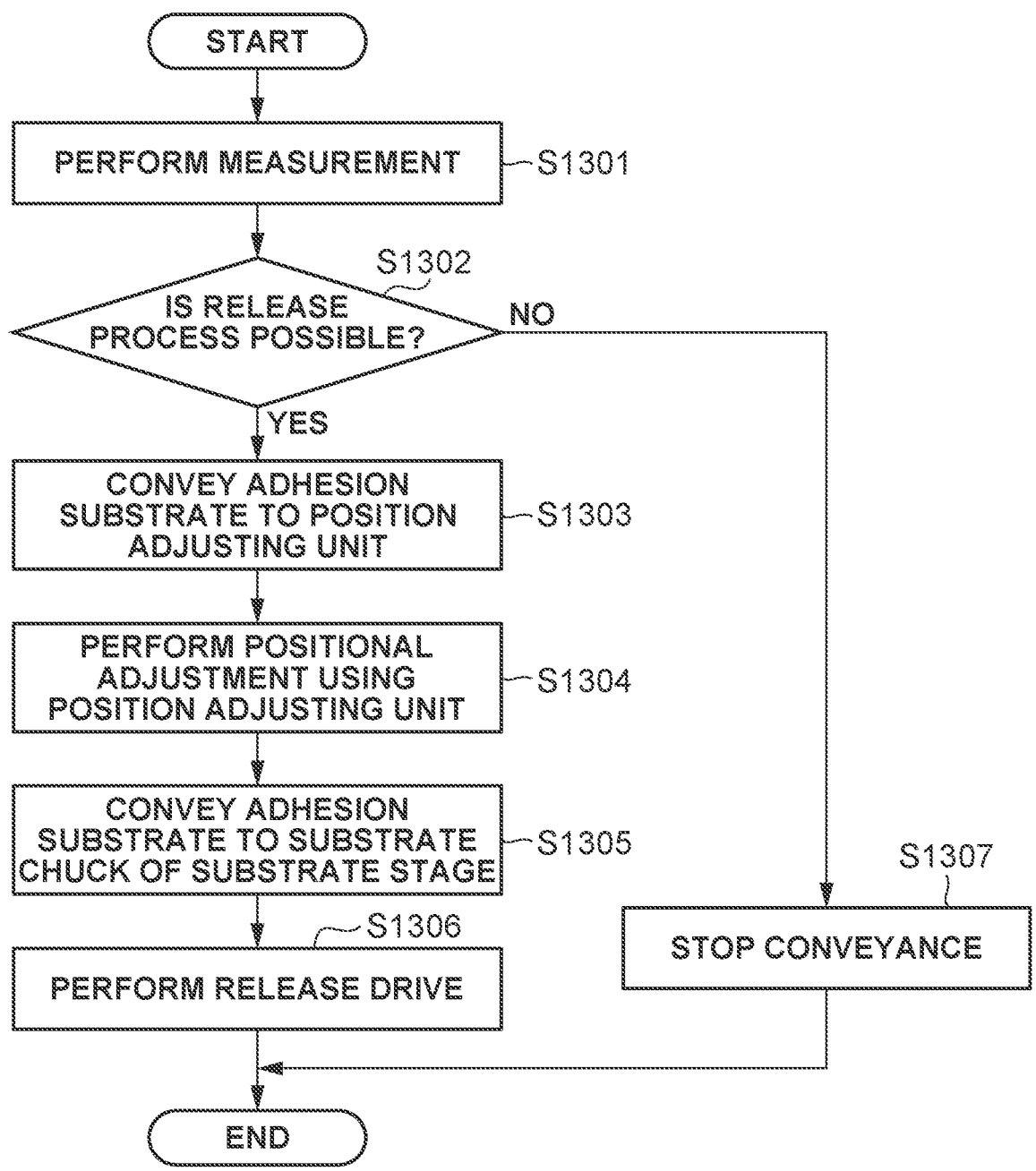
FIG. 13 is a flowchart illustrating operation of conveying an adhesion substrate.

FIG. 13 is a flowchart illustrating operation when release in a planarization process is determined as having failed and an adhesion substrate 110 is conveyed after a positional adjustment is performed so that the adhesion substrate 110 is released using the release assisting mechanism 45. A control apparatus 200 comprehensively controls each unit, thereby executing the following process. The state where the release is determined as having failed may be either a case where the release fails even though release operation is performed using the release assisting mechanism 45, or a case where the release fails after release operation is performed without using the release assisting mechanism 45.

In step S1301, the control apparatus 200 acquires, using an acquisition unit, the state of the peripheral portion of the adhesion substrate 110 in which the plate 9 and the substrate 1 adhere to each other and fail to separate from each other because of a strong adhesive force between the plate 9 and the substrate 1 in a release processing process, thereby acquiring position information such as an overlap position and an overlap amount.

The method described in any of the first embodiment to the third embodiment may be used for the acquisition by the acquisition unit.

In step S1302, based on the acquired position information, the control apparatus 200 determines whether the state of the adhesion substrate 110 corresponds to a state with a positional shift amount for which a release process using the release assisting mechanism 45 is possible.

In step S1303 (YES in step S1302), the control apparatus 200 conveys the adhesion substrate 110 to a position adjusting unit 33. In step S1304, the control apparatus 200 performs a positional adjustment on the adhesion substrate 110 to enable the release process using the release assisting mechanism 45 by moving a drive stage 38 in X and Y directions and rotating the drive stage 38 in a θ direction.

In step S1305, the control apparatus 200 conveys the adhesion substrate 110 to a position at which the release process using the release assisting mechanism 45 of a substrate chuck 2 of the substrate stage 3 is possible, by controlling a conveyance hand 30.

In step S1306, the control apparatus 200 performs release drive for driving a plate chuck 11 downward so that the plate chuck 11 holds the plate 9 by suction, and subsequently driving the plate chuck 11 upward while using the release assisting mechanism 45. The plate 9 and the substrate 1 are thereby separated. Subsequently, the operation returns to a normal planarization process, and the process ends.

On the other hand, in a case where the control apparatus 200 determines that the release process is not possible (NO in step S1302), the release process for the adhesion substrate 110 using the release assisting mechanism 45 cannot be safely continued. Thus, in step S1307, the conveyance of the adhesion substrate 110 to the position adjusting unit 33 is stopped, and a process of carry-out to a FOUP is performed in a manner similar to the manner described in the first embodiment to the third embodiment. In a case where even the process of carry-out to the FOUP cannot be performed, manual conveyance by a person such as an operator is prompted.

According to this method, it is possible to perform the release process using the release assisting mechanism 45 without carrying out the adhesion substrate having once failed in release to the outside of the planarization apparatus 100, so that a risk such as attachment of a foreign substance can be reduced.

Next, a release method by the release assisting mechanism 45 of the present embodiment will be described with reference to FIGS. 12A, 12B, 12C, and 12D.

The release assisting mechanism 45 is included in the substrate stage 3 as a mechanism for assisting the release by reducing an adhesive force in the release process. The release assisting mechanism 45 has a function of pushing up the plate 9 from below in the release process, and is used as an assisting mechanism for reducing the adhesive force by allowing air to enter a portion between the plate and the substrate. The release assisting mechanism 45 may be a push pin in a size to fit into a notch shape of the substrate 1 and to be driven up and down, or may be a vent for blasting air upward from below.

Figure 12A:
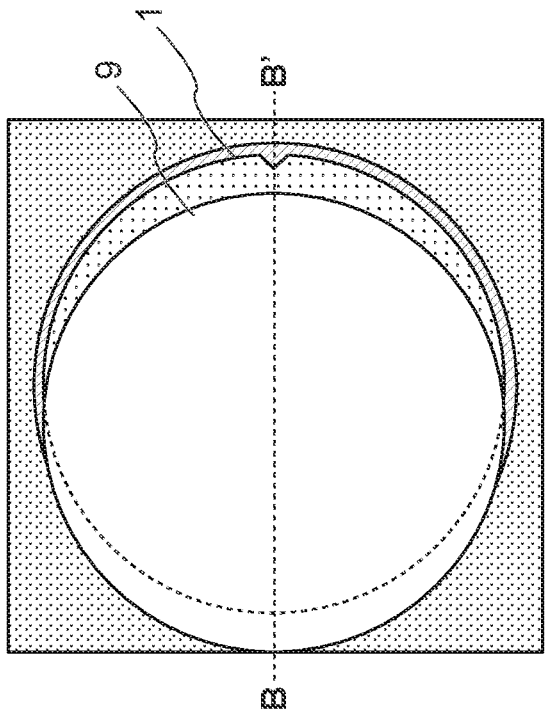
FIGS. 12A, 12B, 12C, and 12D are diagrams illustrating a release assisting mechanism.
Figure 12B:
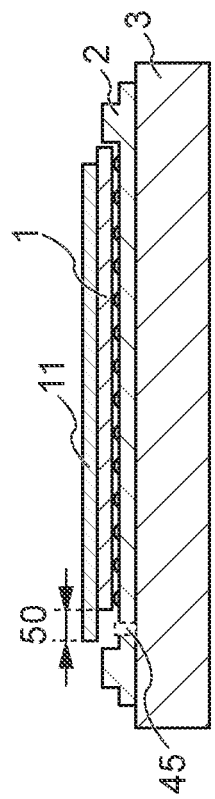

FIG. 12A illustrates a state where the plate 9 is shifted to a great extent with respect to the substrate 1 when the substrate 1 is held on the substrate chuck 2 provided on the substrate stage 3 and the plate 9 is brought into contact with a material on the substrate 1. FIG. 12B is a cross-sectional diagram illustrating the substrate 1, the plate 9, the substrate chuck 2, the substrate stage 3, and the release assisting mechanism 45 at a position A-A' in FIG. 12A. In a case where the substrate 1 and the plate 9 adhere to each other in a state where the respective centers are aligned, the release assisting mechanism 45 can apply a force for reducing the adhesive force to the plate 9 through the space of the notch. However, in a case where the substrate 1 and the plate 9 adhere to each other in a state where the respective centers are not aligned as in FIG. 12B, a region 50 where the substrate 1 is not present is generated below the plate 9. If the region 50 is generated in a case where the diameter of the substrate 1 and the diameter of the plate 9 are substantially the same, the plate 9 is shifted from the substrate 1, and thus a region where the substrate 1 is not covered by the plate 9 is generated. In a case where the plate 9 is not present above the release assisting mechanism 45 as in FIG. 12B, the plate 9 cannot be pushed up, so that the adhesive force is not reduced, and the plate 9 and the substrate 1 come off a plate holding mechanism or a substrate holding mechanism in a state where the plate 9 and the substrate 1 adhere to each other. Thus, in a case where such a situation occurs, it is desirable to perform the release process again after the positioning adjustment described with reference to FIG. 13 is performed.

Figure 12C:
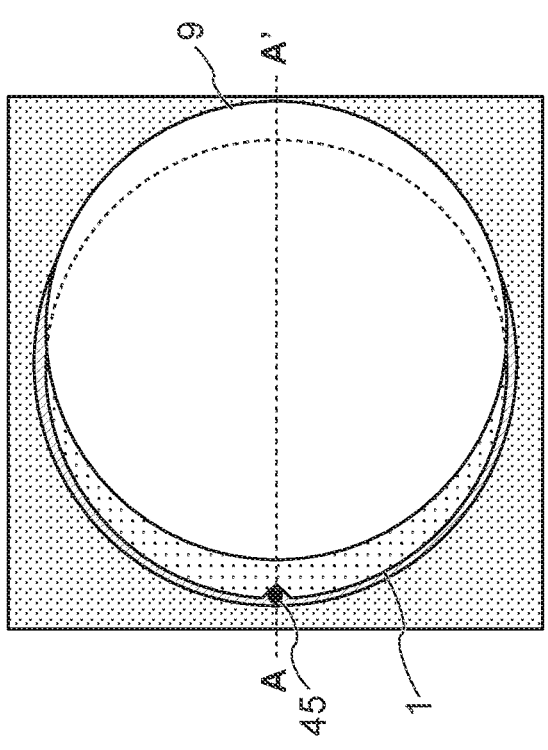
Figure 12D:
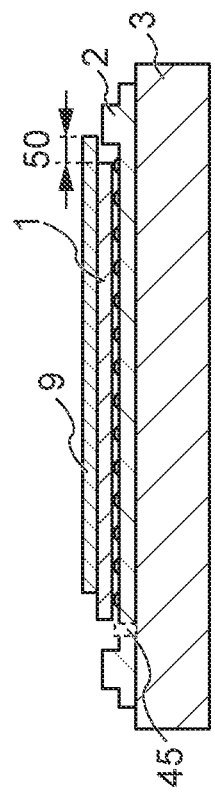

FIG. 12C illustrates a position of the plate 9 and the substrate 1 conveyed again to the substrate chuck 2 provided on the substrate stage 3 by the conveyance hand 30 after the positioning adjustment described with reference to FIG. 13 is performed. FIG. 12D is a cross-sectional diagram illustrating the substrate 1, the plate 9, the substrate chuck 2, the substrate stage 3, and the release assisting mechanism 45 at a position B-B' in FIG. 12C. The adhesion substrate whose position has been adjusted by the position adjusting unit 33 so that the region 50 is placed above the release assisting mechanism 45 is conveyed, so that the release assisting mechanism 45 can apply the force for reducing the adhesive force to the plate 9 through the space of the notch.

Exemplary Embodiment of Article Manufacturing Method

Next, a method of manufacturing an article (such as a semiconductor integrated circuit (IC) element, a liquid crystal display element, a color filter, or a micro electro mechanical system (MEMS)) using the above-described planarization apparatus will be described. The manufacturing method uses the above-described planarization apparatus, and includes a process of planarizing a composition by bringing the composition, which is disposed on a substrate (such as a wafer or a glass substrate), into contact with a plate, a process of curing the composition, and a process of separating the composition and the plate. A planarized film is thereby formed on the substrate. Subsequently, the substrate on which the planarized film is formed is processed, for example, to have a pattern formed thereon using a lithography apparatus, and the processed substrate is processed in another known processing process, so that an article is manufactured. The other known processing process may be etching, resist separation, dicing, bonding, or packaging.

According to the present manufacturing method, an article higher in quality than conventional articles can be manufactured.

While the present disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of priority from Japanese Patent Application No. 2022-026120, filed Feb. 22, 2022, which is hereby incorporated by reference herein in its entirety.

What is claimed is:

1. A conveyance apparatus connected to a substrate processing apparatus configured to bring a pressing member and a material on a substrate into contact with each other to form a cured film of the material on the substrate, the conveyance apparatus comprising:
   an acquisition unit configured to acquire information about a positional shift of the pressing member relative to the substrate in a state in which the material on the substrate is in contact with the pressing member;
   a position adjusting unit configured to adjust positions of the substrate and the pressing member based on a result acquired by the acquisition unit; and
   a conveyance unit configured to convey the substrate and the pressing member adjusted by the position adjusting unit.

2. The conveyance apparatus according to claim 1, wherein the acquisition unit acquires the information about the positional shift while rotating the substrate and the pressing member in the state in which the material on the substrate is in contact with the pressing member.

3. The conveyance apparatus according to claim 2, wherein the acquisition unit acquires the information about the positional shift by acquiring an edge position of a peripheral portion of the substrate and the pressing member in the state in which the material on the substrate is in contact with the pressing member.

4. The conveyance apparatus according to claim 2, wherein the acquisition unit acquires the information about the positional shift by emitting light from a side where the pressing member in the state in which the material on the substrate is in contact with the pressing member is located and measuring an optical path length of reflected light.

5. The conveyance apparatus according to claim 1,
wherein the acquisition unit acquires an image of each of a plurality of regions including an edge of a peripheral portion of the substrate and the pressing member in the state in which the material on the substrate is in contact with the pressing member, and
wherein the position adjusting unit adjusts the positions of the substrate and the pressing member based on the image of each of the plurality of regions.

6. The conveyance apparatus according to claim 1, wherein the position adjusting unit adjusts the position by performing at least one of movement and rotation in a direction parallel to a surface of the substrate and the pressing member in a case where it is determined that an adjustment of the position is necessary based on the result acquired by the acquisition unit.

7. The conveyance apparatus according to claim 1, wherein the conveyance unit carries the substrate and the pressing member, whose position is adjusted by the position adjusting unit, to a holding housing.

8. The conveyance apparatus according to claim 7, wherein the position adjusting unit adjusts the positions of the substrate and the pressing member to avoid interference between the holding housing, and the substrate and the pressing member during carry-out to the holding housing.

9. The conveyance apparatus according to claim 1,
wherein the conveyance unit carries the substrate and the pressing member to a release assisting mechanism configured to release the pressing member from the substrate, and
wherein the position adjusting unit adjusts the positions of the substrate and the pressing member to enable release assistance by the release assisting mechanism.

10. The conveyance apparatus according to claim 1, wherein the substrate and the pressing member each have a circular shape.

11. A conveyance method comprising:
acquiring information about a positional shift of a pressing member relative to a substrate in a state in which a material on the substrate is in contact with the pressing member;
adjusting positions of the substrate and the pressing member based on a result of the acquiring; and
conveying the substrate and the pressing member.

12. A substrate processing apparatus configured to bring a pressing member and a material on a substrate into contact with each other to form a cured film of the material on the substrate, the substrate processing apparatus comprising:
an acquisition unit configured to acquire information about a positional shift of the pressing member relative to the substrate in a state in which the material on the substrate is in contact with the pressing member;
a position adjusting unit configured to adjust positions of the substrate and the pressing member based on a result acquired by the acquisition unit; and
a conveyance unit configured to convey the substrate and the pressing member adjusted by the position adjusting unit.

13. An article manufacturing method comprising:
forming a cured film using the substrate processing apparatus to which the conveyance apparatus according to claim 1 is connected; and
processing the substrate on which the cured film is formed,
wherein an article is manufactured from the processed substrate.

* * * * *